United States Patent [19]

Ochi

[11] Patent Number: 4,542,409
[45] Date of Patent: Sep. 17, 1985

[54] SINGLE GATE LINE INTERLACE SOLID-STATE COLOR IMAGER

[75] Inventor: Shigeharu Ochi, San Jose, Calif.

[73] Assignee: Fuji Photo Film Co., Ltd., Kanagawa, Japan

[21] Appl. No.: 478,975

[22] Filed: Mar. 25, 1983

[51] Int. Cl.⁴ ............................................. H04N 9/07
[52] U.S. Cl. ................................. 358/212; 358/213; 358/44
[58] Field of Search ................. 358/213, 212, 209, 44; 357/30, 24 LR, 24; 250/578

[56] References Cited

U.S. PATENT DOCUMENTS

| | | | |
|---|---|---|---|
| 4,189,749 | 2/1980 | Hiroshima et al. | 358/167 |
| 4,212,634 | 7/1980 | Kokie et al. | 358/213 |
| 4,242,700 | 12/1980 | Weimer | 358/44 |
| 4,281,338 | 7/1981 | Takahashi et al. | 358/44 |
| 4,413,283 | 11/1983 | Aoki | 358/213 |
| 4,456,929 | 6/1984 | Aoki et al. | 358/213 |

Primary Examiner—Gene Z. Rubinson
Assistant Examiner—Robert Lev
Attorney, Agent, or Firm—Sughrue, Mion, Zinn, Macpeak and Seas

[57] ABSTRACT

A solid-state color imager which can be scanned by sequentially activating only single ones of vertical lines. Each pixel of the sensor array includes a light sensing element and a switching element composed of two parallel-connected FET devices. The light sensing element is connected through the conductive channel of the parallel-connected FET devices to an associated horizontal line, with connections in the columnar direction of the array being made to alternate ones of the horizontal lines which define the particular column. The gates of the two FET devices are connected to respective adjacent vertical lines of the array, with one of the gates being activated for scanning for a first field and the other for scanning for a second field.

14 Claims, 9 Drawing Figures

SINGLE GATE LINE INTERLACE SOLID-STATE COLOR IMAGER

BACKGROUND OF THE INVENTION

The invention pertains to a solid-state color imager, specifically, such an imager of the MOS FET type.

An example of a prior art approach to an imager of the same general type to which the invention pertains is described in an article "⅔-Inch Format MOS Single-Chip Color Imager", *IEEE Transactions on Electron Devices*, Vol. ED-29, No. 4, April 1982 by M. Aoki et al. The imager described in this article, and as also illustrated herein in FIGS. 1 and 2, includes a sensor array 100 (FIG. 1) composed of a large number of pixels (picture elements) arranged in a matrix of rows and columns. The sensor array 100 includes horizontally extending electrodes 21, 22, 23, 24, ... which intersect with vertically extending electrodes 30, 31, 32, 33 ... All of these electrodes are electrically insulated from one another. Each pixel 10 includes a light sensing element, composed of a photodiode 12 and a parallel-connected capacitor 13, and a switching element, implemented as an FET device 11. The gate 15 of the FET device 11 is connected to a corresponding horizontally extending electrode (electrode 21 for the pixel 10 in the upper left-hand portion of FIG. 2), the drain of the FET device 11 is connected to a respective one of the vertically extending electrodes (electrode 30 for the pixel 10 in the upper left-hand portion of FIG. 2), and the source of the FET device 11 is coupled to the cathode of the photodiode 12. Color filters are provided over each of the photodiodes 12, with the filters being arranged in an appropriate pattern for color imaging. In the example of FIG. 2, "W" indicates the presence of a white filter over the respective photodiode, "Ye" indicates a yellow filter, "G" indicates a green filter, and "Cy" indicates a cyan filter. As is well known to those of ordinary skill in the art, other filter patterns can be used as well.

The vertically extending electrodes (hereinafter termed "horizontal lines" for reasons which will later become clear) 30, 31, 32, 33 ... are each associated with an output signal which carries information about a single color. Specifically, in FIG. 2, $H_W(j)$, $H_G(j)$, $H_{Ye}(j)$ and $H_{Cy}(j)$ indicate the j-th white, green, yellow and cyan output signals, respectively. To effect this arrangement, each of the lines 30, 31, 32, 33 ... is connected to the drains of all FET devices of all pixels of the associated color in the corresponding column. For instance, the line 31 is connected to all drains of all FET devices 15 in the corresponding column which are coupled to photodiodes 12 having green filters.

The horizontally extending conductors (hereinafter termed "vertical lines", again for reasons which will later become clear) 21, 22, 23, 24 ... each connect to the gates 15 of all FET devices 11 of all pixels in the corresponding row.

During the operation of the array, between readout times, the conductivity of the photodiodes 12 varies in accordance with the intensity of the light shone thereon. Accordingly, the charge across each of the capacitors 13 at the end of the read-out period is determined by the average intensity of the light which shone on the corresponding photodiodes 12 between read-out times. To read out the color information signals thus generated from each of the pixels 10, the vertical lines 21, 22, 23, 24 ... are activated, that is, raised to a positive voltage, in a particular sequence. Because the activation of the vertical lines 21, 22, 23, 24 ... in sequence corresponds to scanning the sensor array in the vertical direction, the lines 21, 22, 23, 24 are termed a "vertical lines", even though each line extends in the horizontal direction.

FIGS. 4A and 4B show a segment of an integrated circuit implementation of the circuit of FIG. 2. The vertical lines 30 and 31 are arranged intersecting, but insulated from, the horizontal lines 21 and 22. A light sensing area is formed in the rectangular openings defined between intersecting pairs of the horizontal and vertical lines, for instance, between lines 21, 22, 30 and 31. Source diffusions 19 (indicated by dash-dot-dash lines) are formed in the substrate 41, extending into each of the openings. A diode-junction forming layer (not shown) is provided over portions of each source diffusion to form the photodiodes. Other portions of each of the source regions 19 extend under respective ones of the horizontal lines, for instance, a portion of the source diffusion 19 which is partially within the opening bounded by the lines 21, 22, 30 and 31, shown in the center of FIG. 4A, extends under the horizontal line 30. The source diffusion 19 extends up to a position under and adjacent to a side of a respective one of the vertical lines. For instance, the source diffusion 19 in the center of FIG. 4A extends up to the lower edge of the line 21. A source contact 17 is thusly formed. Drain diffusions 18 (indicated by dash-dot-dot-dash lines), which make electrical contact with respective ones of the horizontal lines at drain contact areas 16, also extend under corresponding horizontal lines, up to positions adjacent to but under the edge of the respective vertical line and opposite the corresponding source diffusion 19. At intersections between the horizontal and vertical lines where the source diffusion 19 and drain diffusion 18 are formed, the vertical lines 21, 22, etc. are separated from the substrate only by a thin oxide layer. In this manner, a gate region 15 is formed between each drain diffusion 18 and source diffusion 19. For intersections of vertical and horizontal lines where the drain and source diffusions do not extend up to the edges of the vertical line, a thick insulating layer is provided to separate the vertical line from the surface of the substrate so as to prevent the potential on the vertical line from interfering with the operation of the device. This arrangement is illustrated in the cross-sectional view of FIG. 4B where the vertical line 21 is separated from the surface of the substrate 41 by a layer of field oxide 40, while the line 22 is separated from the surface of the substrate 41 by only a thin oxide layer between the source diffusion 19 and drain diffusion 18.

The circuitry used for reading out the color information signals from the pixels 10 and communicating these signals to the utilization circuitry (display device, recording device, etc.) is depicted in FIG. 1. To activate the vertical lines 21, 22, 23, 24 ... a vertical shift register 103 is provided. The vertical shift register successively and sequentially sets a positive voltage on its output lines VS(O), ..., VS(i), ... VS(n-1), VS(n) which are applied to an interlace circuit 104. The interlace circuit 104 also receives signals FA (Frame A) and FB (Frame B) indicative of which of two interlaced frames is currently to be scanned. The outputs of the interface circuit 104 are buffered and applied to the vertical lines 21, 22, 23, 24, ... of the sensor array 100 by a buffer circuit 105 with the aid of clock signals $\phi_{V2}$ and $\phi_{V3}$. The outputs from the sensor array $H_W(j)$, $H_G(j)$, etc., on lines 30, 31, etc., are applied to an array output switching circuit 102 and communicated upon a bus 107 to the utilization circuitry in accordance with outputs provided by a horizontal shift register 101.

In the sensor array shown in FIG. 2, to provide the color information necessary to form a complete picture element, it is necessary to read out the color signal information contained in four adjacent pixels, namely, a block of adjacent white, yellow, green and cyan sensitive pixels, and hence to cause color signal read out on four horizontal lines (e.g., $H_w(j)$, $H_G(j)$, $H_{Ye}(j)$, $H_{Cy}(j)$). Moreover, luminance information is provided with every vertical pair (e.g., $H_w(j)$, $H_G(j)$ and $H_{Ye}(j)$, $H_{Cy}(j)$), thus providing improved horizontal resolution. To read out the color information, it is necessary to activate two of the vertical lines 21, 22, 23, 24, . . . for each line scan, that is, for each of VS(0), etc. Further, for purposes of interlacing, it is necessary that the pairing of the vertical lines be changed between frames. For instance, for a frame A, the lines 21 and 22 are simultaneously activated, followed by simultaneous activation of lines 23 and 24. For the subsequent frame B, the lines 22 and 23 are simultaneously activated, followed by simultaneous activation of line 24 and a next following line (not shown). This is indicated at the left-hand side of FIG. 2 by signals $V_A(i)$ (vertical line, Frame A, i-th line scan), $V_A(i+1)$, . . . $V_B(i)$, $V_B(i+1)$. For interlaced scanning, the activation sequence is . . . $V_A(0)$, . . . , $V_A(i)$, $V_A(i+1)$, . . . , $V_B(0)$, . . . , $V_B(i)$, $V_B(i+1)$, . . . , where two vertical lines are activated for each of $V_A(0)$, etc.

An example of the interlace circuit 104 and the buffer circuit 105 is illustrated in FIG. 3 wherein there is shown a single interlacing section 30 and a single buffer section 35. The interlace circuit 104 and the buffer circuit 105 are, of course, composed of a plurality of such sections; however, because each section is identical, only single sections are shown here. An output signal VS(i) from the vertical shift register 103 is applied to drains of each of four FET devices 91–94 of the interlacing section 30. The signal FA (Frame A) is applied to the gates of the devices 91 and 92, while the signal FB (Frame B) is applied to the gates of the devices 93 and 94. The conductive channels of the devices 92 and 93 are connected in parallel. The reason for this is the necessity for causing overlapping activation of pairs of vertical lines for interlaced scanning. The sources of the devices 91 and 94 and the paired devices 92 and 93 are coupled to gates of corresponding driver devices 95 in the buffer section 35. The drains of the devices 95 are coupled in common to a source of the clock signal $\phi_{V3}$. "Bootstrap" capacitors 98 are coupled between the gates and drains of the devices 95. The $\phi_{V2}$ clock signal is applied through devices 99 to discharge the vertical electrodes.

As should be clear by this point, the above-described prior art approach is disadvantageous because of the necessity for simultaneously activating two of the vertical lines during the scanning of the sensor array. Because two lines must always be simultaneously activated, a high drive capability for the buffer circuit is required. Also, relatively complex interlacing and buffer circuits are necessary.

Accordingly, it is a primary object of the present invention to obviate the above-mentioned drawbacks of the prior art approach discussed above, specifically, to provide a solid-state color imager in which it is necessary to activate only a single vertical line at a time for scanning the sensor array, and accordingly to provide an imager which requires only very simple and physically small vertical interlacing and buffering circuitry.

SUMMARY OF THE INVENTION

These, as well as other objects of the invention, are met by providing a solid-state imager including a grid of electrodes composed of first and second sets of mutually perpendicular electrodes. A light sensing element and a signal switching element are provided for each opening in the grid of electrodes so formed. In accordance with an important aspect of the invention, the switching element is implemented with a pair of first and second semiconductor switches with the first and second semiconductor switches having conductive channels coupled in parallel with one another and coupled between the output of a respective light sensing element and a corresponding one of the first electrodes. The control inputs of the first and second semiconductor switches are coupled to two different ones of the second electrodes which form the associated matrix opening. The connections to the first electrodes alternate in the columnar direction. Preferably, the semiconductor switches are implemented with MOS FET devices. The first and second semiconductor switches can be implemented with separate devices or, equivalently, they can be implemented with a single device having a single conductive channel and two gates positioned such that activation of either gate will turn on the conductive channel.

In terms of the semiconductor structure of the imager, the invention may be practiced by a solid-state imager including a semiconductor substrate, a set of generally parallel first electrodes, a set of generally parallel second electrodes arranged generally perpendicular to the first electrodes with both the first and second electrodes being disposed on the semiconductor substrate and with all of the first and second electrodes being electrically insulated from one another, a plurality of source diffusions formed in the semiconductor substrate with one of the source diffusions being provided for each of the openings formed at intersections of pairs of the first electrodes and pairs of the second electrodes, and a plurality of drain diffusions formed in the semiconductor substrate. The source diffusions each extend from the light sensing area in the openings under a respective one of the first electrodes to positions adjacent the two second electrodes which define the associated opening. Drain diffusions are formed under the same first electrode extending to positions under the first electrode adjacent the edges of both of the second electrodes which form the associated opening on sides of the second electrodes opposite the source diffusions. Gates are thus formed between the source diffusions and drain diffusions. The drain diffusions are electrically connected to respective ones of the first electrodes. In the columnar direction, from pixel to pixel, the source diffusions extend under alternate ones of the corresponding pair of first electrodes which define the openings in the column, and the drain diffusions are accordingly also formed under alternate ones of the first electrodes. A light sensing layer, such as a diode-junction forming layer, is formed over the source diffusions. Color filters are placed over each of the light sensing layers.

DESCRIPTION OF THE PREFERRED EMBODIMENTS

Figure 1:
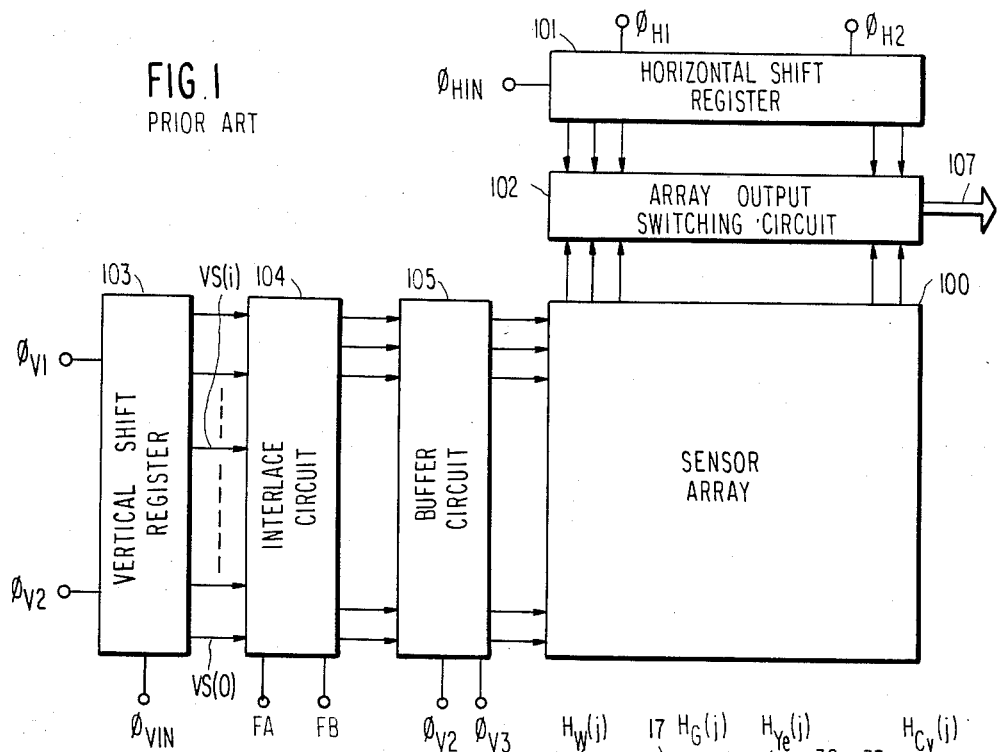
FIG. 1 is a block diagram of a color imager of the same general type to which the invention pertains.
Figure 2:
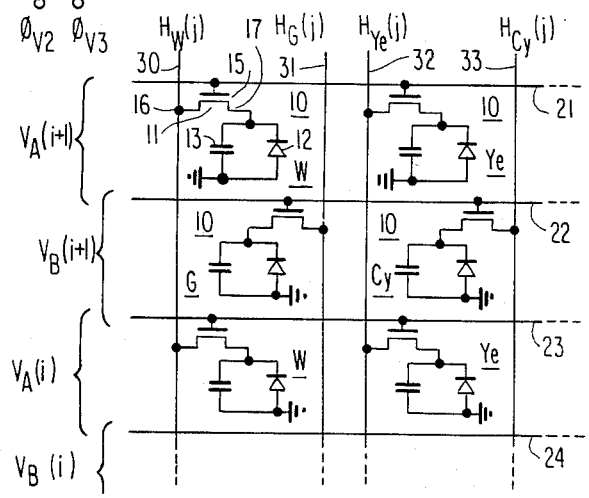
FIG. 2 is a schematic diagram of a prior art sensor array used in the color imager of FIG. 1.
Figure 3:
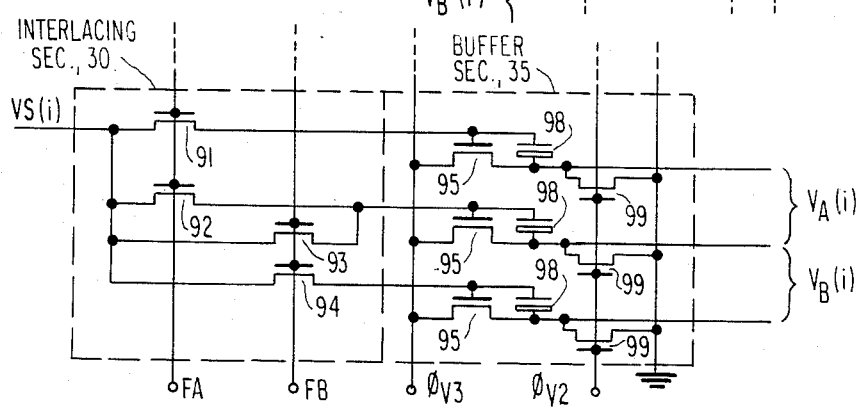
FIG. 3 is a schematic diagram of a portion of an interlacing circuit and a buffer circuit utilized in the prior art imager.
Figure 4A:
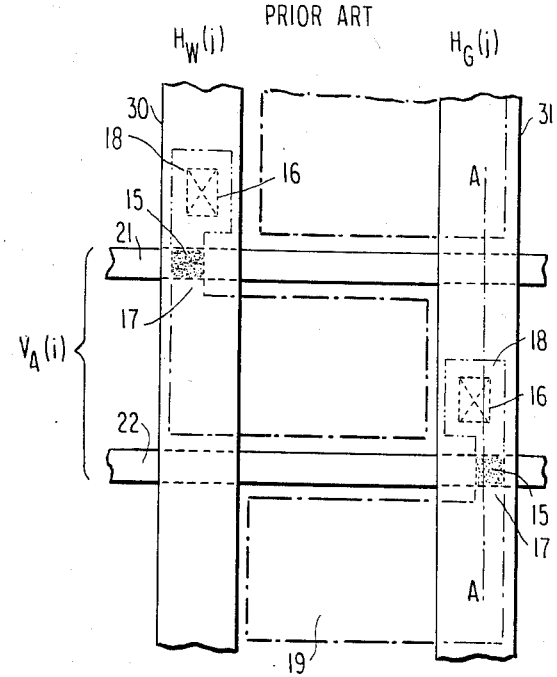
FIGS. 4A and 4B are, respectively, a top view and cross-sectional view showing the physical construction of the prior art sensor array.
Figure 4B:
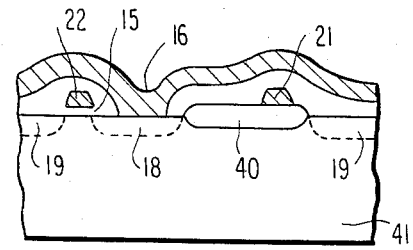
Figure 5:
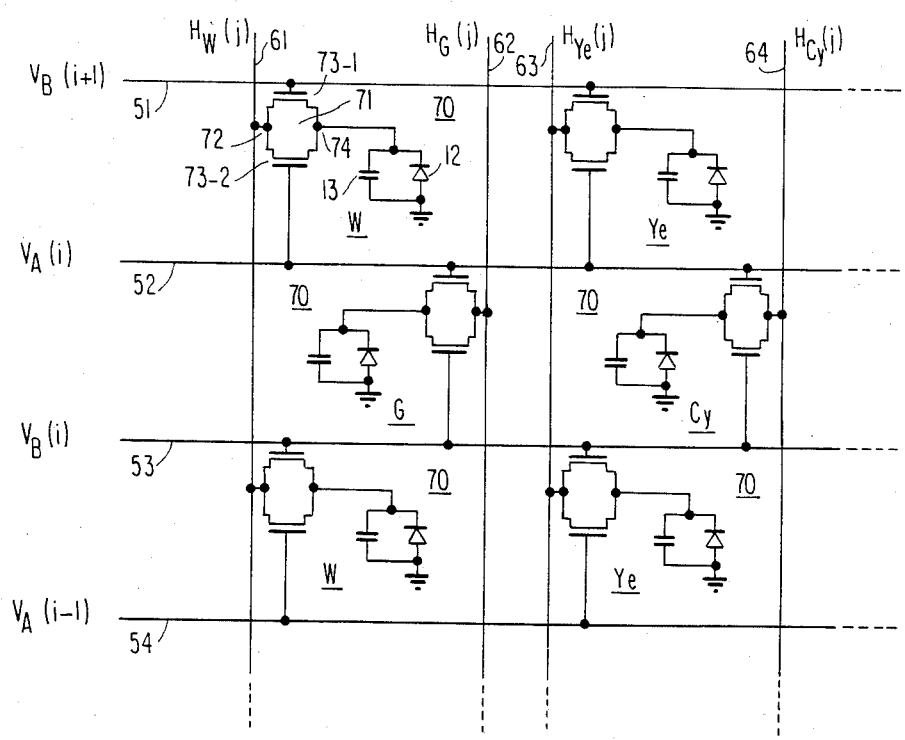
FIG. 5 is a schematic diagram of a sensor array of the invention.

FIG. 5 is a schematic diagram showing a portion of a sensor array 100 constructed in accordance with the teachings of the invention. Similar to the case of the prior art arrangement described with reference to FIG. 2, the array of the invention includes a plurality of horizontal lines 61, 62, 63, 64... and a plurality of vertical lines 51, 52, 53, 54..., the numbers of which are the same as in the prior art arrangement for a sensor of like numbers of scanning lines. The light sensing portion of pixels 70 includes a photodiode 12 and capacitor 13, similar to the prior art array.

For color information signal switching, a switching element 71 is provided composed of two parallel-connected FET devices 73-1 and 73-2. The conductive channels of the devices 73-1 and 73-2 (between source contacts 74 and drain contacts 72) are connected between the cathode of the photodiode 12 and a respective one of the horizontal lines (line 61 for the pixel in the upper left-hand portion of FIG. 5). Commonly connected drains of alternate ones, in the columnar direction, of the switching devices are connected to alternate ones of the horizontal lines which define the right and left sides of the pixels in the respective column. The gate of the device 73-1 is coupled to the vertical line which forms the upper side of the cell and the gate of the device 73-2 is connected to the vertical line which forms the lower side of cell. Color filters are provided for the photodiodes 12 in the same pattern as utilized in the prior art arrangement.

Figure 7A:
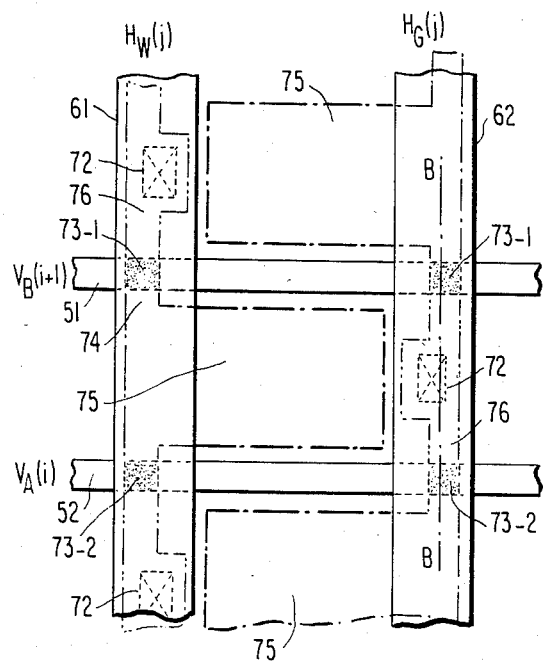
FIGS. 7A and 7B are, respectively, a top view and a cross-sectional view showing the physical construction of the sensor array of the invention.
Figure 7B:
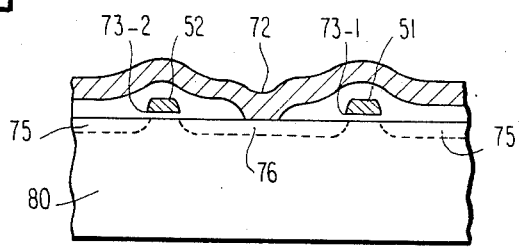

Referring now to FIGS. 7A and 7B, the physical construction of the pixels of the sensor array illustrated in schematic form in FIG. 5 is shown. Similar to the prior art arrangement, the array includes horizontal lines 61, 62, ... and vertical lines 51, 52, ... with rectangular openings defined by intersecting pairs of horizontal and vertical lines. In accordance with the invention, source diffusions 75 (dash-dot-dash lines) are formed which extend over the major portion of the openings and extend under one of the horizontal lines, for example, the horizontal line 61 for the source diffusion 75 shown in the center of FIG. 7A. Under the horizontal line 61, the source diffusion 75 reaches to a position directly under the edges of both adjacent vertical lines 51 and 52. Drain diffusions 76 (dash-dot-dot-dash lines) are also formed under the horizontal lines, but under positions of the horizontal lines where there is no source diffusion, that is, under the horizontal lines at every other pixel position. Each drain diffusion 76 extends to the edge of both adjacent vertical lines (lines 51 and 52 for the drain diffusion 76 shown at the center-right of FIG. 7A). Thus, gates 73-1 and 73-2 are formed at opposite ends of each drain diffusion 76. Each drain diffusion 76 is connected to a respective horizontal line in a contact area 72.

With this construction, it is necessary to activate only a single vertical line at a time during the scanning operation of the sensor array. With reference back to FIG. 5, if line 52, for example, is activated, it may be seen that gates of four pixels, one each of white, yellow, green and cyan, are activated. Hence, the drive capacity needed for the associated buffer circuit is remarkably reduced over that of the prior art arrangement of FIG. 2. To carry out interlaced scanning, the vertical lines are activated in a simple sequence such as $V_A(0), \ldots, V_A(i), V_A(i+1), \ldots, V_B(0), \ldots V_B(i-1), V_B(i), \ldots,$ where a single vertical line is activated for each of $V_A(0)$, etc. Because it is not necessary to activate vertical lines in pairs or to change the pairing of vertical lines between frames A and B, the structure of the interlace circuit is made quite simple.

Figure 6:
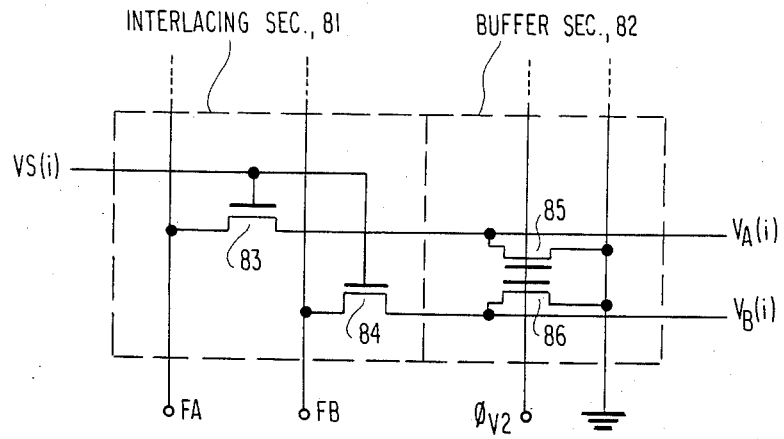
FIG. 6 is a schematic diagram of a portion of an interlacing circuit and buffer circuit utilized with the sensor array of the invention.

Referring now to FIG. 6, an example of a portion of suitable interlace and buffer circuits is illustrated. The section 81 of the interlace circuit includes only two FET devices, devices 83 and 84, the gates of which are connected to a single vertical shift register output line VS(i) and the drains of which receive the FA and FB signals, respectively. The source outputs of the devices 83 and 84 may be applied directly to drive corresponding vertical lines of the sensor array. Devices 85 and 86 are used to discharge the vertical electrode voltages $V_A(i)$ and $V_B(i)$, respectively, with the use of the clock signal $\phi_{V2}$. Hence, it may be seen that the need for the clocking signal $\phi_{V3}$ has been eliminated with the sensor array of the invention, thus providing still another advantage.

This completes the description of the preferred embodiments. Although preferred embodiments have been described, it is believed that numerous alterations and modifications thereto would be apparent to one of ordinary skill in the art without departing from the spirit and scope of the invention.

I claim:

1. A solid-state imager comprising
   a grid of electrodes;
   a plurality of light sensing means arranged at interstices in said grid of electrodes; and
   a plurality of switching means, a pair of first and second ones of said switching means being provided for each of said light sensing means, each of said first and second ones of said switching means of each said pair of said switching means selectively coupling a respective one of said light sensing means to a respective first one of said electrodes, and said first and second ones of said switching means having control inputs coupled to respective second and third ones of said electrodes.

2. The solid-state imager of claim 1, further comprising means for activating each of said switching means in a predetermined sequence including activation of each of said first and second ones of said switching means alternately.

3. The solid-state imager of claim 1, wherein said grid of electrodes comprises first and second sets of electrodes, said first one of said electrodes belonging to said first set of electrodes and said second and third ones of said electrodes belonging to said second set of electrodes.

4. The solid-state imager of claim 1, wherein said grid of electrodes comprises a set of generally parallel first electrodes and a set of generally parallel second electrodes, said first electrodes being arranged generally perpendicular to said second electrodes; wherein said first one of said electrodes is one of said set of second electrodes; and wherein said second and third ones of said electrodes are adjacent ones of said set of first electrodes.

5. The solid-state imager of claim 4, wherein each of said switching means comprises an FET device.

6. The solid-state imager of claim 4, further comprising means for activating each of said first electrodes one at a time in a predetermined sequence.

7. The solid-state imager of claim 6, wherein said activating means comprises means for alternately activating even- and odd-ordered ones of said first electrodes.

8. In a solid-state color imager of a type having a plurality of pixels arranged in an array, each of said pixels comprising a light sensing element and a signal switching element, a set of generally parallel first electrodes, and a set of generally parallel second electrodes arranged generally perpendicular to said first electrodes, the improvement wherein: each of said switching elements comprises first and second FET devices having conductive channels coupled in parallel with one another and between a respective light sensing element and a respective one of said first electrodes, a gate of said first FET device being coupled to one of said second electrodes, and a gate of said second FET device being coupled to another of said second electrodes adjacent said one of said second electrodes.

9. The solid-state color imager of claim 8, wherein said pixels are arranged in rows and columns, and wherein, with respect to any one of said pixels except for pixels at ends of columns, in a pixel above said one pixel in the same column, said second gate is coupled to said one of said second electrodes, and in a pixel below said one pixel in said column, said first gate is coupled to said another of said second electrodes.

10. The solid-state imager of claim 9, wherein all of said first gates of all pixels in the same row are coupled in common to one of said second electrodes above said row and all of said second gates of all pixels in said row are coupled in common to one of said second electrodes below said row of pixels.

11. The solid-state imager of claim 9, further comprising means for activating said second electrodes one at a time in a predetermined sequence.

12. The solid-state imager of claim 11, wherein said activating means comprises means for activating in sequence all odd-ordered ones of said second electrodes then activating in sequence all even-ordered ones of said second electrodes.

13. The solid-state imager of claim 12, wherein said activating means comprises: a shift register; an interlacing circuit having inputs coupled to respective outputs of said shift register; and a buffer circuit coupled between outputs of said interlacing circuit and said second electrodes; said interlacing circuit comprising, for each output of said shift register, a single FET device having a conductive channel coupled between a source of a signal for activating a predetermined one of even- and odd-ordered ones of said second electrodes and to a respective one of said second electrodes, and a gate coupled to a respective output of said shift register; and said buffer circuit comprising, for each output of said interlacing circuit, a single FET device having a conductive channel coupled between a source of a first clock signal and a respective one of said second electrodes and a gate coupled to a source of a second clocks signal.

14. A solid-state color imager comprising:
a semiconductor substrate;
a set of generally parallel first electrodes;
a set of generally parallel second electrodes arranged generally perpendicular to said first electrodes, said first and second electrodes being disposed on said semiconductor substrate, and all of said first and second electrodes being insulated from one another;
a plurality of source diffusions formed in said semiconductor substrate, one of said source diffusions being provided for each of a plurality of openings formed at intersections of pairs of said first electrodes and pairs of said second electrodes, each of said source diffusions extending into a respective one of said openings and under a portion of a respective one of said first electrodes to positions under said respective one of said first electrodes adjacent intersections of both of said second electrodes which form said respective one of said openings, alternate ones of said source diffusions in a direction parallel to said first electrodes extending under alternate ones of the pair of said first electrodes which form said respective one of said openings;
a plurality of drain diffusions formed in said semiconductor substrate, each of said drain diffusions being provided under a respective one of said first electrodes on sides of each of said openings opposite a side where a respective one of said source diffusions extends under said respective one of said first electrodes, each of said drain diffusions extending to positions adjacent intersections of the pair of said second electrodes which form the respective one of said openings, each of said drain diffusions being electrically coupled to the one of said first electrodes under which it lies, said second electrodes forming gate regions at each intersection with said second electrodes between respective ones of said source and drain diffusions; and
a plurality of light-sensing layers, one of said light sensing layers being layer coupled to each of said source diffusions.

* * * * *